United States Patent [19]

Natsui

[11] 4,347,586

[45] Aug. 31, 1982

[54] SEMICONDUCTOR MEMORY DEVICE

[75] Inventor: Yoshinobu Natsui, Tokyo, Japan

[73] Assignee: Nippon Electric Co., Ltd., Tokyo, Japan

[21] Appl. No.: 157,736

[22] Filed: Jun. 9, 1980

[30] Foreign Application Priority Data

Jun. 7, 1979 [JP] Japan .................................. 54-71409

[51] Int. Cl.³ ............................................. G11C 11/40
[52] U.S. Cl. .................................... 365/174; 365/189;
365/230
[58] Field of Search ................ 365/174, 182, 189, 230

[56] References Cited

U.S. PATENT DOCUMENTS 4,272,834 6/1981 Noguchi .............................. 365/174

Primary Examiner—Terrell W. Fears
Attorney, Agent, or Firm—Sughrue, Mion, Zinn, Macpeak & Seas

[57] ABSTRACT

A semiconductor programmable memory device fabricated with high integration and programmable with high stability and flexibility is disclosed. The programmable memory device is characterized in that a write current limiter circuit for limiting a write current passing through a programmable element included in the device upon programming or writing within a predetermined value is provided in a current path for feeding the write current.

16 Claims, 13 Drawing Figures

SEMICONDUCTOR MEMORY DEVICE

The present invention relates to a semiconductor memory device employing programmable memory elements and more particularly to a programmable read-only semiconductor memory device.

With regard to the memory element to which information can be written, that is, the so-called programmable memory element, various types of memory elements have been developed so far. The so-called double junction type Programmable Read-Only Memory (PROM) in which conventional bipolar transistors are employed as one type of such memory elements, and existence or non-existence of destroying or electrically shorting of their base-emitter junctions is made to correspond to stored information, has been remarked in view that a fuse-link as of nichrome is unnecessary but the conventional bipolar process is applicable thereto. Such a double junction type PROM is described in the U.S. Pat. No. 3,848,238. Especially in the memory device employing transistors having open-circuited bases as memory elements, the collector-base junctions can be used as decoupling diodes in a memory element matrix array. In addition, since the collectors can be made common along the row direction, they need not be insulated in the row directon. Therefore, this device has been widely used in practice.

In a known semiconductor memory device employing the memory elements of double junction type, as will be seen in the commercially available examples such as programmable ROM's, programmable logic arrays (PLA's), etc., the write current has a considerably large value typically as large as 200 mA.

As a current handled in a semiconductor integrated circuit, this current value is very large; in order to make it possible to control such a large current, low-impedance high-withstand-voltage circuit elements are required for a write current path. In consequence, all the circuit elements in the peripheral circuit become large in size. Accordingly, the large write current is a greater barrier to the reduction in chip size and the shortening of propagation delay time upon read operation.

As one solution for this problem, a method is known in which a memory element that can be written with low energy is developed by reducing a size of the memory element, thereby enabling writing with a small current and a low voltage. As a result, reduction in size of the circuit elements in the peripheral circuit can be achieved.

In a memory element realized in such manner, though the write current can be certainly reduced, in the case of passing a large current of the order of 200 mA therethrough, there occurs a possible problem that the PN-junction between a collector and a base which should remain for decoupling use upon constituting a matrix array, may be possibly degraded or destroyed, resulting in impossibility of writing.

In addition, since the impedance of the write current path is generally increased by the reduction in size of the memory elements and the peripheral circuit, an excessively high voltage possibly may be applied across the elements in the peripheral circuit, resulting even in breakdown of the elements of the peripheral circuit. Accordingly, in a method for stably writing in such memory elements that can be written with a small current, no problem will remain if an optimum current is fed into the PROM chip from the outside there of by adjusting an outside writer and if clamping at an optimum voltage is effected. However, in view of the correlation between the writer and the PROM on the other hand, if the condition for the write current and clamp voltage of the writer is varried each time the process in the PROM is changed, then the exchangeability among the existing writers would be entirely lost.

Therefore, it is one object of the present invention to provide a semiconductor memory device having a peripheral circuit which can feed an optimum current to a memory element having a small write current to stably achieve writing without changing the condition of writing.

Another object of the present invention is to provide a semiconductor memory device in which writing can be achieved stably even if the external write current is large.

One feature of the present invention resides in that a write current can be limited without appreciably raising a D.C. impedance of a write path by incorporating a current limiting circuit in a peripheral circuit for feeding a write current.

The semiconductor memory device according to the present invention is characterized in that in a semiconductor memory device including memory elements to which information can be written or programmed by passing a write current therethrough and a switching circuit for effecting control of the write current, the current flowing through the memory elements and the write current path is limited to a predetermined value or lower by incorporating means for limiting the current in the write current path.

According to one feature of the present invention, there is provided a semiconductor memory device, in which a current limiter circuit is provided in a write current path within a semiconductor chip so that only a desired magnitude of current from a writer may flow through a desired memory element to be written, and the surplus current from the writer is bypassed through a constant voltage clamp circuit provided within the semiconductor chip so that an excessively large voltage can be prevented from being applied to the semiconductor chip especially to the peripheral circuit, whereby the memory elements can be stably written with an optimum current.

According to another feature of the present invention, a semiconductor chip can be reduced in size by employing memory elements having a small write current, and it becomes possible to stably write information in a semiconductor device having an improved access speed under conventional write conditions.

While the present invention is generally applicable to memory elements in which information is written by passing a current therethrough, it is especially effective for memory elements which necessitate writing with a large current such as the memory elements of double junction type or fuse-link type. Therefore, the preferred embodiments of the present invention will be described hereunder in connection to a combination with the memory elements of double junction type as illustrated in the accompanying drawings.

FIG. 2 is an illustration of writing in a memory cell, in which FIG. 2(a) shows an equivalent circuit diagram of a memory cell under an unwritten condition, and FIG. 2(b) shows an equivalent circuit diagram of a memory cell after writing;

Now the present invention will be described in detail with reference to the accompanying drawings.

Figure 1:
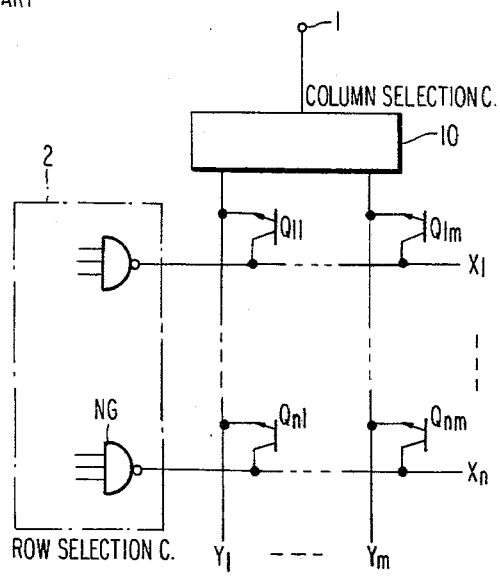
FIG. 1 is a block diagram showing a structure of a PROM in the prior art.
Figure 2:
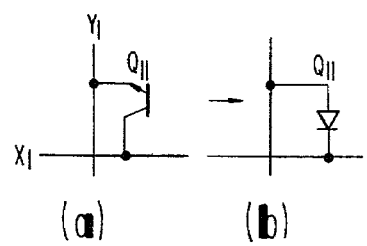

Referring to FIG. 1, there is shown one example of the heretofore known programmable ROM employing double junction type cell array. This is a simple example of a memory circuit in which a row selection circuit 2 having a plurality of NAND gates NG and a column selection circuit 10 are associated with a cell array of n rows by m columns. The column selection circuit 10 is structured by a plurality of gates for selectively connecting one of column lines $Y_1 \ldots Y_m$ to a write terminal 1 in a known manner. A write operation will be described hereunder with reference to this figure. Assuming now that a row line $X_1$ is selected by the row selection circuit 2 and a column line $Y_1$ is selected by the column selection circuit 10, then a memory cell $Q_{11}$ disposed between these row and column lines becomes a selected condition, and when a write current is fed from a write terminal 1, all the write current flows sequentially through the column selection circuit 10, column line $Y_1$, the memory cell $Q_{11}$, row line $X_1$ and row selection circuit 2, so that the emitter-base junction of the cell $Q_{11}$ is electrically shorted and the cell is converted from the state shown in FIG. 2(a) into the state shown in FIG. 2(b) where only the base-collector junction remains to be used as a decoupling diode in the cell array. In this case, if memory elements that can be written with low energy are used for the cells $Q_{11}-Q_{nm}$, and if a large current of such as 200 mA is fed as a write current at a clamp voltage of 28 V of a writer under the condition of the writer (not shown) providing a write voltage to the terminal 1, then writing can be achieved in the same manner as the above-described write operation. However, for the memory elements that can be written with low energy, the above-mentioned write current fed from the writer is excessive, and hence there occurs a disadvantage such that degradation of the base-collector junction arises as described above or an excessively large voltage is applied to the semiconductor chip due to the increase of the write impedance.

Figure 3:
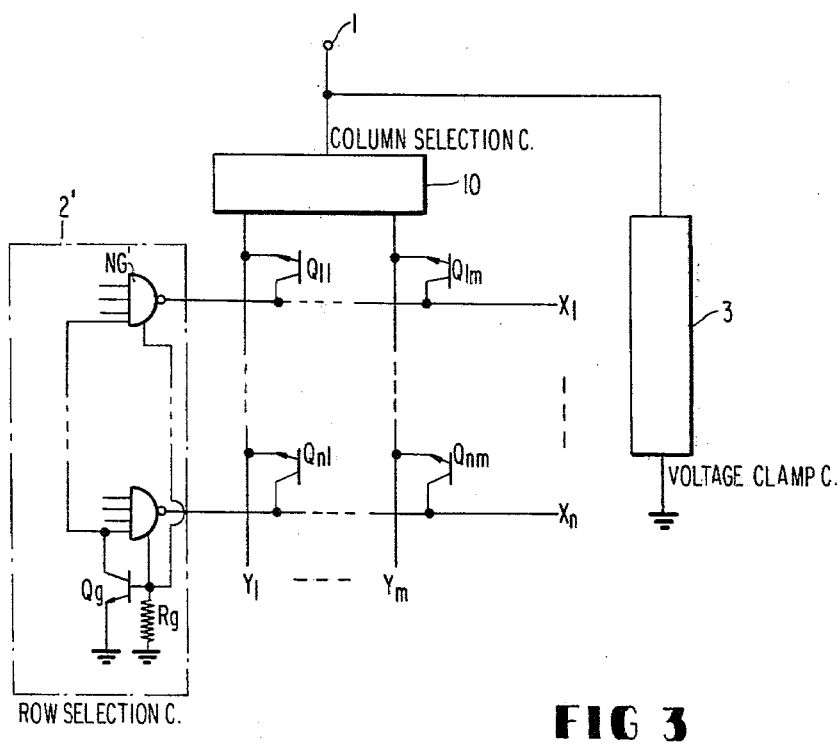
FIG. 3 is a block diagram showing one preferred embodiment of the present invention.

In one preferred embodiment of the present invention illustrated in FIG. 3, a current limiter circuit consisting of a feedback transistor Qg and a write current detecting resistor Rg is contained in the row selection circuit 2 including NAND gates NG' in the heretofore known circuit in FIG. 1, and a constant voltage clamp circuit 3 is provided to the write terminal 1. Assuming now that a write current is fed to the memory device from the write terminal 1 according to the condition of the writer in the same manner as the above-described write operation, when this write current flows through only one gate at a conductive state in the column selection circuit 10, a selected memory cell in the memory cell array, only one NAND gate NG' at a conductive state whose output is in a low level to sink the write current in the row selection circuit 2' and the write current detecting resistor Rg to ground, if the potential difference across the resistor Rg reaches a threshold value of the feedback transistor Qg, then the transistor Qg becomes conducting and serves to turn the NAND gate NG' at the conductive state having a low level output to a nonconductive state, that is, to a state having a high level output, and thereby it acts upon the NAND gate NG' in the direction of reducing the current flowing therethrough. Consequently, since the current flowing through the NAND gate NG' tends to decrease and thus the current flowing through the current detecting resistor Rg also tends to decrease, there arises a tendency of driving the feedback transistor Qg towards its cut-off condition, thereby the write current flowing through the write current detecting resistor Rg settles at a certain equilibrium condition.

Owing to the formation of such feedback loop, the current flowing into the selected gate settles at a predetermined value, and any more current cannot be absorbed by the gate. Accordingly, if it is assumed that the resistance of the current detecting resistor Rg is selected so as to preset the current absorption capability of the gate, for example, at 50 mA, and that a write current of 200 mA is fed from the writer to the cell array, then since the gate can absorb only 50 mA, the output voltage of the gate begins to rise abruptly, and in accordance with this rise of the gate output voltage the potential at the write terminal 1 tends to rise up to the clamp voltage (for instance, 28 V) preset by the writer.

However, if the write terminal 1 is allowed to rise up to the clamp voltage, then the memory elements in the semiconductor chip will be required to have a high withstand voltage, and thus the object of realizing the reduction in size of the memory elements by reducing a write current and by lowering a withstand voltage of the elements will become unable to be achieved. Therefore, according to the present invention, a constant voltage clamp circuit 3 is added to bypass a surplus write current.

Now the structure and operation of the semiconductor memory circuit shown in FIG. 3 will be explained in more detail with reference to FIG. 4.

A NAND gate NG' in a row selection circuit 2' is composed of a multi-emitter transistor $T_1$ having address signals applied to the respective emitters thereof, transistors $T_2-T_4$ and a diode $D_1$. When all the input signals to the emitters of the transistor $T_1$ are at a high level, the driver transistor $T_4$ is made to conduct, so that one of the row lines, for instance, a row line $X_1$ is brought to a low level that is approximately equal to the ground level and thereby the NAND gate NG' absorbs a write current fed through a column selection circuit 10.

Then, since the write current flows through a current detecting resistor Rg, the magnitude of the current can be detected as a potential drop across the resistor Rg, and hence, by effecting feedback of this potential drop to one emitter of the multi-emitter transistor $T_1$ via a feedback transistor Qg, the magnitude of the current absorbed by the NAND gate NG' can be maintained at a fixed value. The emitter to which the potential drop is fed back may be optionally one of the emitters receiving the address signals or may be an independently formed one only for the input feed back input.

When the clamp voltage preset by the writer is, for example, 28 V, the constant voltage clamp circuit 3 serves to clamp the write terminal 1 at a voltage lower than a voltage in the chip which is lower than the withstand voltage of the elements, for instance, at 20 V. In this constant voltage clamp circuit 3, if the ratio of the resistance $R_1$ and $R_2$ is appropriately selected so that transistors $Q_1$ and $Q_2$ may turn ON when the write terminal 1 reaches any given voltage $V_c$, then the circuit can achieve the object of clamping the write terminal 1 at a constant voltage $V_c$ by abruptly lowering its impedance, and thereby the voltage applied to the circuit elements and the memory elements in the semiconductor chip can be suppressed to a voltage lower than the voltage $V_c$. It is to be noted that in the constant voltage clamp circuit 3, a Zener diode $D_Z$ serves as a decoupling diode in the case where the write terminal 1 is also used as an output terminal upon read operation.

Figure 10:
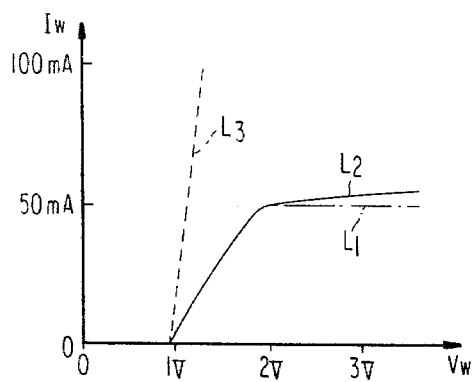
FIG. 10 is a diagram showing a current characteristic of the row selection circuit according to the present invention.

In one preferred embodiment, the resistance of the current detecting resistor Rg in the row selection circuit 2' was selected to be 15 ohm. The characteristic curve of a write current $I_W$ versus a write voltage $V_W$ in this instance is shown by a dash-dot line $L_1$ in FIG. 10.

In one example of application of the semiconductor memory device according to the present invention, the device was a 8192-bit programmable read-only-memory device in which memory elements that can be written with a write current of 50 mA and that would be deteriorated by a write current of 100 mA or more were used as the programmable memory elements. While 64 NAND gates NG' were necessitated, only one each of the current detecting resistor Rg and feedback transistor Qg were necessitated because they could be used in common to all the NAND gates NG'. Since the size of the driver transistors as well as various elements contained in the write path could be reduced owing to the reduction of the write current, the size of the semiconductor chip could be reduced by about 30%. In addition, the propagation delay time could be also shortened by 20%. While writing was effected under the conventional write condition (the external write current being 200 mA), they operated normally and deterioration of the written memory elements was not found.

As described above, according to the present invention, even though a semiconductor memory device is composed of memory elements having an optimum write current value that is smaller than that of the conventional memory elements, the memory device can be written stably while retaining the conventional write condition, and moreover it can be written stably even if the precision of the external write current is poor.

Now other examples of the current-limiting type row selection circuit that is effectively used according to the present invention will be described with reference to FIGS. 5 to 9. In the following explanation, description will be made with respect to one NAND gate NG'' included in the row selection circuit 2''.

Figure 5:
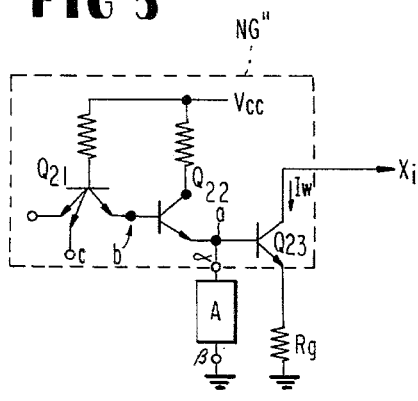
FIG. 5 is a circuit diagram showing another detailed example of a row selection circuit in the preferred embodiment shown in FIG. 3.

In FIG. 5, a transistor $Q_{23}$ is a driver transistor which directly controls a write current $I_W$ fed from a given row line $X_i$. When the potentials at all the emitters of a multi-emitter transistor $Q_{21}$ are raised to a high level, transistors $Q_{22}$ and $Q_{23}$ are turned ON to allow the write current $I_W$ to flow through the NAND gate NG''.

In order to realize a constant current characteristic, it is only necessary to insert a current detecting resistor Rg between the emitter of the driver transistor $Q_{23}$ and the lowest potential source (i.e. the ground) and to insert a constant voltage element A between the base of the driver transistor $Q_{23}$ and the ground. Then the limited value $I_{WL}$ of the write current $I_W$ is derived from the following equation:

$$I_{WL} = (V_A - V_{BE})/R_g \tag{1}$$

where $V_A$ represents a voltage across the constant voltage element A, and $V_{BE}$ represents a base-emitter voltage (hereinafter represented simply by $V_{BE}$) of the driver transistor $Q_{23}$ when the write current $I_W$ fulfils the relation $I_W = I_{WL}$.

The circuit point to which the constant voltage element A is connected is not limited to the base of the driver transistor, but it could be any such point such that by connecting the constant voltage element A to that point the base current of the driver transistor $Q_{23}$ is decreased as the voltage across the current detecting resistor Rg increases. In the case of the circuit shown in FIG. 5, it could be either point "b" or point "c". However, in these modified cases, for the value of $V_{BE}$ in equation (1) above it is necesary to substitute the potential differences between the points "b" and "c", respectively, and the emitter of the driver transistor $Q_{23}$ when the write current $I_W$ fulfils the relation $I_W = I_{WL}$.

Figure 6:
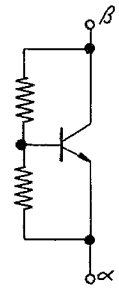
FIGS. 6 and 7 are circuit diagrams respectively showing examples of a constant voltage element to be used in the circuit shown in FIG. 5.
Figure 7:

In addition, it is to be noted that in the case where the stage preceding to the driver transistor $Q_{23}$ employs a Darlington connection or an emitter-follower type, not as effect can be expected by connecting the constant voltage element A to the base of the driver transistor $Q_{23}$, and hence, such connection should be avoided. For the constant voltage element A, a transistor associated with resistors as shown in FIG. 6 or a series circuit consisting of a predetermined number of diodes as shown in FIG. 7 can be used.

Figure 8:
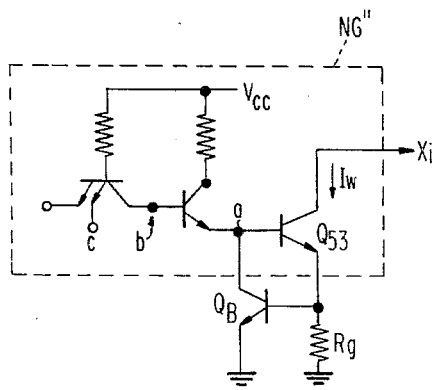
FIGS. 8 and 9 are circuit diagrams respectively showing other examples of the row selection circuit shown in FIG. 5.

Another method for realizing a current limiting characteristic is illustrated in FIG. 8. According to this alternative method, a current detecting resistor Rg is inserted between an emitter of a driver transistor $Q_{53}$ and the ground, the base of a feedback transistor $Q_B$ is connected to the upper end of the resistor Rg, the emitter of the same transistor $Q_B$ is connected to the ground, and its collector is connected to the base of the driver transistor $Q_{53}$ so that a signal corresponding to the magnitude of the current may be negatively fed back to the base of the transistor $Q_{53}$. This alternative method can provide a better constant current characteristic than the first method illustrated in FIG. 5. According to this alternative method, the limited value $I_{WL}$ of the write current is derived from the following equation:

$$I_{WL} = V_B/R_g \tag{2}$$

where $V_B$ represent a base-emitter voltage $V_{BE}$ that is necessitated for turning the transistor $Q_B$ ON. In this alternative method also, the circuit point where the collector of the transistor $Q_B$ is connected need not be the base of the driver transistor $Q_{53}$, but it could be point "b" or point "c" in FIG. 8. Furthermore, the limited write current value $I_{WL}$ would not vary even if the connection point is changed.

In the case that a plurality of switching circuits (NAND gates NG'') are included in the row selection circuit 2', since only one switching circuit can be selected at one time, the current detecting resistor $R_g$ can be used in common to all the switching circuits without providing one for each switching circuit. In addition, with respect to the constant voltage element A and the feedback transistor $Q_B$ also, a single element can be used in common to all the switching circuits via respective decoupling diodes. If such provision is made, then even when the current limiting characteristic is incorporated, the increase of elements per one additional switching circuit is only one decoupling diode. In the case where the element A or $Q_B$ is connected to the point "c", a decoupling diode therefor is unnecessary because the emitter-base junction of the transistor $Q_{21}$ or $Q_{51}$ serves as a decoupling diode.

Figure 9:
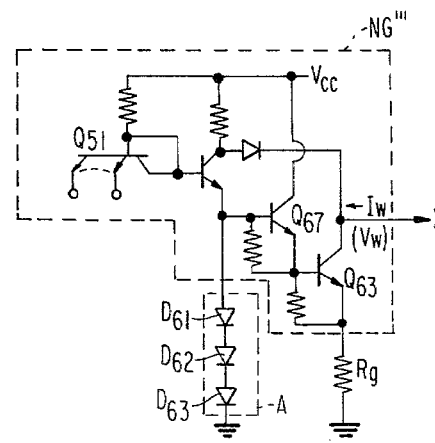

One practical example of the switching circuit having a current limiting capability is illustrated in FIG. 9. In this circuit, a series connection of three diodes $D_{61}$, $D_{62}$ and $D_{63}$ is used as a constant voltage element A. Among these three diodes, the diode $D_{61}$ also serves as a decoupling diode in the case that the diodes $D_{62}$ and $D_{63}$ are used in common to all the switching circuits NG'''. The resistance value of the current detecting resistor $R_g$ was selected to be 16 ohm. In this instance, the relation between the write current $I_W$ and the collector level $V_W$ of the driver transistor $Q_{63}$ presents a constant current characteristic in the neighborhood of 50 mA as shown by a solid line $L_2$ in FIG. 10. In this figure is also indicated a current-voltage characteristic in the case of not incorporating the current limiting characteristic (in the case of Rg=0 ohm) by a dotted line $L_3$.

Now another preferred embodiment of the present invention will be described with reference to FIGS. 11 and 12.

Figure 4:
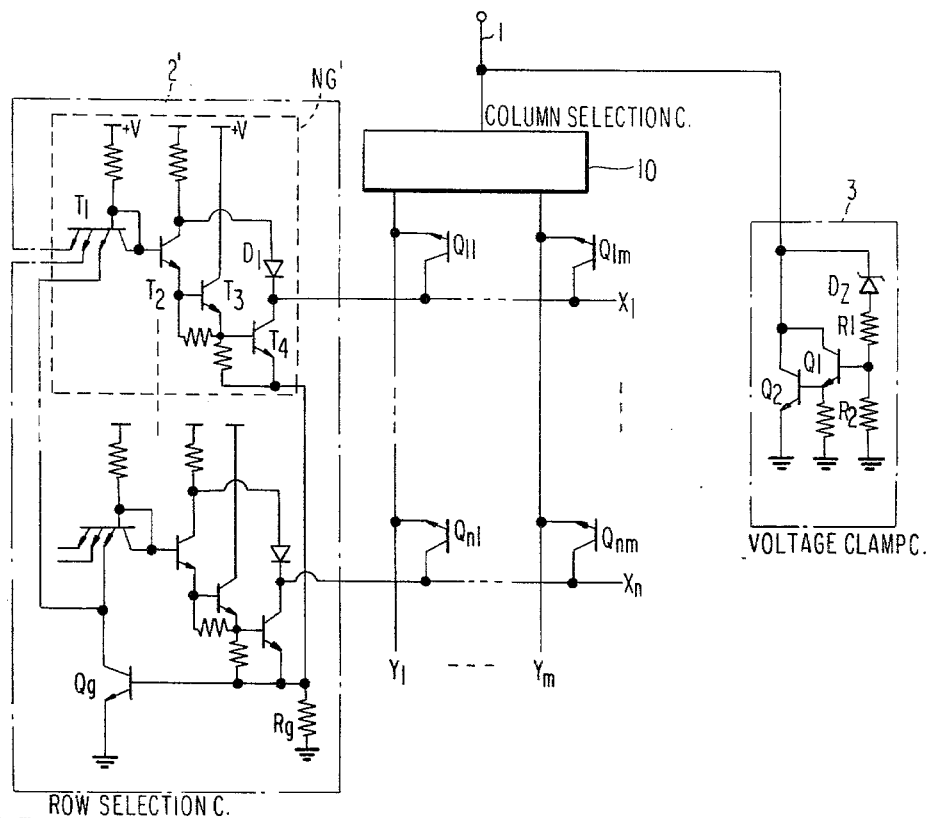
FIG. 4 is a circuit diagram showing a detailed example of the preferred embodiment shown in FIG. 3.
Figure 11:
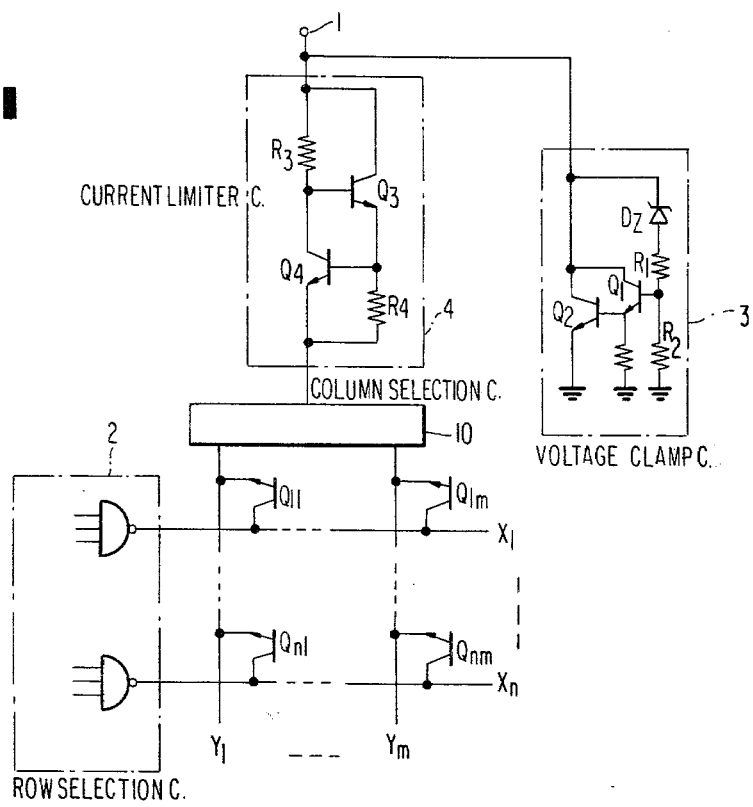
FIG. 11 is a block diagram showing another preferred embodiment of the present invention.

In the circuit shown in FIG. 11, a current limiting circuit 4 is provided between a write terminal 1 and a column selection circuit 10 in place of employing the row selection circuit 2' with the current limiting capability, and a constant voltage clamp circuit 3 is connected between the write terminal 1 and the ground similarly to the circuit according to the first preferred embodiment shown in FIGS. 3 and 4. First, description will be made on the operation of the current limiting circuit 4. When a write current is fed from the write terminal 1, the current flows through a collector-emitter path of a transistor $Q_3$ and a resistor $R_4$ forming a main path in the current limiting circuit 4, the column selection circuit 10, and one selected memory element such as, for example, $Q_{11}$ to a row selection circuit. When the voltage drop across the current detecting resistor $R_4$ reaches the threshold value of a feedback transistor $Q_4$, the transistor $Q_4$ becomes enabled and acts upon the transistor $Q_3$ so as to make it cut off, and thereby it tends to reduce the current flowing through the transistor $Q_3$. Then, since the current flowing through the current detecting resistor $R_4$ tends to decrease, the transistor $Q_4$ is again driven towards cut-off.

Owing to such a feedback loop, the current flowing through the transistor $Q_3$ settles substantially at a fixed value, and if one tries to make a current exceeding this fixed value flow through the current limiter circuit 4, then due to the existence of the resistor $R_3$ the voltage at the write terminal 1 tends to rise up to the clamp voltage preset by the writer. However, through the same mode of operation as explained previously in connection to the first preferred embodiment, the voltage at the write terminal 1 is clamped at the voltage $V_c$ by the constant voltage clamp circuit 3.

Figure 12:
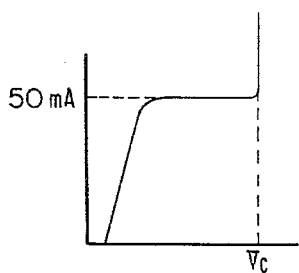
FIG. 12 is a diagram showing the effects of the preferred embodiment illustrated in FIG. 11.

In both the first and second preferred embodiments of the present invention, assuming that the current value detecting resistor $R_g$ is designed so that the desired current value becomes 50 mA, a D.C. impedance of the write current path as viewed from the write terminal 1 presents the characteristics shown in FIG. 12, in which the current rises at an inclination corresponding to the sum of the internal impedance of the write current path plus the resistance of the current value detecting resistor $R_g$, a constant current characteristic is presented at a current level of 50 mA, and further the voltage is clamped at the voltage $V_c$.

As described above, according to the present invention, owing to the fact that a current limiter circuit and a voltage limiter circuit are provided within a PROM chip, even in the case where a large current clamped at a high voltage is fed externally to a PROM chip as a write current, the current can be appropriately attenuated by the limiter circuits, memory elements which are writable with low energy can be written with an optimum current, and the voltage upon writing can be suppressed to a low voltage. Therefore, stable writing can be achieved without occurrence of deterioration and/or destruction of the memory elements.

Thus, even if manufacturing conditions of memory elements and peripheral circuits should be changed due to improvements in the manufacturing process, writing with an optimum write current can be achieved in the respective instances without modifying the writing conditions, and thereby enhancement in performance of PROM's can be easily realized.

Though description has been made on the memory device employing the double junction type memory elements, the present invention is not limited to the memory device employing such memory element, but is applicable to all memory devices in which programming or writing to memory elements which require a electric current on programming or writing such as fuse-link type PROM and a non-volatile type RAM are used.

I claim:

1. A semiconductor memory device comprising a plurality of column lines, a plurality of row lines intersecting said column lines, a plurality of programmable memory cells disposed at the intersections of said column lines and said row lines, a write terminal connectable to a write current source, the state of each of said memory cells being changed by supplying thereto an electric current larger than a predetermined value, a column selection circuit for selectively providing a first current path between a selected one of said column lines and said write terminal, a row selection circuit for selectively providing a second current path between a selected one of said row lines and a reference voltage source different from said write current source, and a current limiter circuit associated with one of said first and second current paths for limiting the amount of write current supplied to a selected memory cell designated by the selected column line and the selected row line within a regulated amount larger than said predetermined value.

2. The device according to claim 1, further comprising a voltage limiter circuit for clamping the voltage of the selected column line within a predetermined value.

3. The device according to claim 2, in which each of said memory cells is made of a bipolar transistor having an open-circuited base.

4. The device according to claim 3, in which said current limiter circuit is provided in said second current path.

5. The device according to claim 3, in which said current limiter circuit is provided in said first current path.

6. A semiconductor memory device comprising a plurality of column lines, a plurality of row lines intersecting with said column lines, a plurality of memory cells, the state of each of said memory cells being changed by supplying thereto an electric current greater than a threshold value, a write terminal to which a write power source is applied, a column node, a column selection circuit for selectively providing a first current path between said column node and a selected one of said column lines, a current limiter circuit coupled between said write terminal and said column node for limiting the amount of an electric current caused by said write power source flowing therethrough within a predetermined value more than said threshold value, said current limiter circuit including a first resistor, a first bipolar transistor having a collector coupled to said write terminal and a base coupled to said write terminal through said first resistor, a second bipolar transistor having a collector coupled to the base of said first bipolar transistor, a base coupled to an emitter of said first bipolar transistor and an emitter coupled to said column node, and a second resistor coupled between the base and the emitter of said second bipolar transistor, and a row selection circuit for selectively providing a second current path between a selected one of said row lines and a current sink source.

7. The memory device according to claim 6, curther comprising a voltage limiter circuit for clamping the voltage at the selected column line.

8. The device according to claim 7, in which each of said memory elements is made of a bipolar transistor.

9. A semiconductor device comprising a write terminal to which a write power source for writing is supplied, a plurality of row lines, a plurality of column lines intersecting with said row lines, a plurality of programmable elements arranged at intersections of said row lines and said column lines, state of each of said programmable elements being changed by passing an electric current of more than a first predetermined value therethrough, a column selection circuit for selectively electrically coupling one of said column lines to said write terminal thereby to supply a write current caused by said write power source to said one of said column lines, a common point, a row selection circuit for selectively electrically coupling one of said row lines to said common point thereby to provide an electrical path for the write current therebetween, a reference voltage source, and a current limiter circuit coupled between said common point and said reference voltage source for limiting the write current within a second predetermined value larger than said first predetermined value.

10. The device according to claim 9, further comprising a clamp circuit for clamping a voltage at the selected column line within a preset value.

11. The device according to claim 10, in which said row selection circuit includes a plurality of NAND gates having outputs coupled to said row lines.

12. The device according to claim 11, in which said current limiter circuit includes a resistor coupled between said common point and said reference voltage and a transistor for feedbacking a voltage appeared across said resistor to one of inputs of said NAND gates.

13. A semiconductor device a comprising a write terminal to which a write power source is applied, a plurality of row lines, a plurality of column lines intersecting with said row lines, a plurality of programmable elements arranged at intersections of said row lines and column lines, a first point, a current limiter circuit coupled between said write terminal and said first point for limiting an electric current therebetween to produce a regulated amount of current at said first point, a column selection circuit for selectively electrically connecting one of said column lines to said first point, a reference voltage source, a row selection circuit for selectively coupling one of said row lines to said reference voltage source, in which said programmable element is programmed by said regulated amount of current.

14. The memory device according to claim 9 or 13, in which each of said programmable element is made of a bipolar transistor having a collector connected to one of said column lines and an emitter connected to one of said row lines.

15. A semiconductor memory device comprising a plurality of column lines, at least one row line intersecting with said column lines, a plurality of memory cells disposed at the intersections of said column lines and row lines, the state of each of said memory cells being changed by supplying an electric current larger than a threshold value thereto, a write terminal to which a write power source is applied, a column selection circuit for selectively providing an electric path between selected one of said column lines and said write terminal, a reference voltage source, a switching bipolar transistor, means for connecting a collector of said switching bipolar transistor to said row line, a resistor coupled between an emitter of said switching bipolar transistor and said reference voltage source, means for operatively supplying a base of said switching bipolar transistor with base current capable of conducting said switching bipolar transistor, and means for regulating the amount of said base current so as to limit the amount of current flowing through said resistor.

16. The memory device according to claim 15, further comprising a clamp circuit for clamping voltage at the selected column line within a predetermined voltage.

* * * * *

UNITED STATES PATENT AND TRADEMARK OFFICE
CERTIFICATE OF CORRECTION

PATENT NO. : 4,347,586

DATED : August 31, 1982

INVENTOR(S) : Yoshinobu NATSUI

It is certified that error appears in the above—identified patent and that said Letters Patent is hereby corrected as shown below:

Col. 1, line 41, change "greater" to --great--.

Col. 5, line 62, change " 2". " to -- 2'. --.

Col. 6, line 31, delete "to".

Col. 9, line 33, change "curther" to --further--.

Signed and Sealed this

Twenty-second Day of February 1983

[SEAL]

Attest:

GERALD J. MOSSINGHOFF

Attesting Officer  Commissioner of Patents and Trademarks